United States Patent
Wierer, Jr. et al.

(10) Patent No.: US 9,595,616 B1
(45) Date of Patent: Mar. 14, 2017

(54) VERTICAL III-NITRIDE THIN-FILM POWER DIODE

(71) Applicant: Sandia Corporation, Albuquerque, NM (US)

(72) Inventors: Jonathan Wierer, Jr., Coopersburg, PA (US); Arthur J. Fischer, Sandia Park, NM (US); Andrew A. Allerman, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/957,012

(22) Filed: Dec. 2, 2015

(51) Int. Cl.
| | |
|---|---|
| H01L 21/268 | (2006.01) |
| H01L 29/66 | (2006.01) |
| H01L 29/861 | (2006.01) |
| H01L 29/20 | (2006.01) |
| H01L 29/06 | (2006.01) |
| H01L 21/02 | (2006.01) |

(52) U.S. Cl.
CPC ...... *H01L 29/8613* (2013.01); *H01L 21/0254* (2013.01); *H01L 21/268* (2013.01); *H01L 29/0619* (2013.01); *H01L 29/2003* (2013.01); *H01L 29/6609* (2013.01)

(58) Field of Classification Search
CPC ... H01L 29/778; H01L 29/20; H01L 21/0254; H01L 21/268; H01L 29/66; H01L 29/0619; H01L 29/2003; H01L 29/6609
See application file for complete search history.

(56) References Cited

U.S. PATENT DOCUMENTS

| | | | | |
|---|---|---|---|---|
| 5,045,502 A * | 9/1991 | Lau | ............. | H01L 21/28575 257/745 |
| 2001/0042866 A1* | 11/2001 | Coman | ............. | H01L 33/32 257/103 |
| 2003/0189212 A1* | 10/2003 | Yoo | ............. | H01L 33/0079 257/79 |
| 2004/0110395 A1* | 6/2004 | Ueda | ............. | H01L 21/76251 438/795 |
| 2005/0205883 A1* | 9/2005 | Wierer | ............. | H01L 33/0079 257/98 |
| 2005/0205884 A1* | 9/2005 | Kim | ............. | H01L 33/18 257/98 |
| 2006/0284187 A1* | 12/2006 | Wierer | ............. | B82Y 20/00 257/79 |
| 2008/0093611 A1* | 4/2008 | Hahn | ............. | H01L 33/22 257/95 |
| 2008/0099780 A1* | 5/2008 | Tran | ............. | H01L 33/0079 257/103 |
| 2008/0267238 A1* | 10/2008 | Takeuchi | ............. | B82Y 20/00 372/46.012 |
| 2011/0201180 A1* | 8/2011 | Elgawadi | ............. | H01L 33/0079 438/478 |
| 2012/0057816 A1* | 3/2012 | Krasulick | ............. | G02B 6/12 385/14 |
| 2012/0149148 A1* | 6/2012 | Dallesasse | ............. | H01L 25/167 438/107 |

(Continued)

*Primary Examiner* — Fazli Erdem
(74) *Attorney, Agent, or Firm* — Kevin W. Bieg

(57) ABSTRACT

A vertical III-nitride thin-film power diode can hold off high voltages (kV's) when operated under reverse bias. The III-nitride device layers can be grown on a wider bandgap template layer and growth substrate, which can be removed by laser lift-off of the epitaxial device layers grown thereon.

26 Claims, 6 Drawing Sheets

(56) References Cited

U.S. PATENT DOCUMENTS

| | | | |
|---|---|---|---|
| 2013/0210214 A1* | 8/2013 | Dallesasse | H01L 21/8258 438/458 |
| 2013/0316481 A1* | 11/2013 | Park | H01L 33/0079 438/46 |
| 2014/0147987 A1* | 5/2014 | Zhao | H01L 33/0079 438/458 |
| 2014/0220716 A1* | 8/2014 | Steigerwald | H01L 33/62 438/27 |
| 2014/0225122 A1* | 8/2014 | Takeya | H01L 29/66666 257/76 |
| 2015/0171271 A1* | 6/2015 | Inoue | H01L 33/38 257/98 |
| 2015/0228729 A1* | 8/2015 | Zhu | H01L 29/872 257/76 |
| 2016/0027964 A1* | 1/2016 | Park | H01L 33/06 257/13 |
| 2016/0079468 A1* | 3/2016 | Gomez-Iglesias | H01L 33/0079 438/29 |

* cited by examiner 248 nm excimer laser (> 1 J/cm²)

~1mm

US 9,595,616 B1

VERTICAL III-NITRIDE THIN-FILM POWER DIODE

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to wide bandgap semiconductor power electronics and, in particular, to a vertical III-nitride thin-film power diode.

BACKGROUND OF THE INVENTION

Wide bandgap (WBG) semiconductor power electronics (PE) constitute an emerging new set of technologies for the switching and conversion of electrical power, which collectively is poised to transform US and world energy economics. WBG PE will accelerate the electrification of transportation, the adoption of efficient building technologies, and the flexible integration of renewable energy sources for a responsive smart grid. While not yet fully developed, WBG power device performance already far exceeds that of the 50-year-old incumbent silicon (Si) technology. Replacing Si-based PE with WBG-based PE can reduce losses significantly, while also reducing size, weight, and cooling requirements.

As the name implies, a "wide bandgap" semiconductor is one having a large bandgap energy. Typically, semiconductors with bandgap energies larger than 2 eV are said to be "wide bandgap." The AlN—GaN—InN system (i.e., AlGaN semiconductors) of WBG semiconductors has been extensively studied for fabricating light-emitting devices for wavelengths shorter than green. There are many potential applications of nitride-semiconductor power electronic devices because of their high breakdown electric field and electron drift velocity at high electric fields. These characteristics of high voltage and high carrier density are particularly effective in enabling the fabrication of smaller devices delivering high output power at high frequencies.

SUMMARY OF THE INVENTION

The present invention is directed to a vertical III-nitride thin-film power diode and a method for fabricating the power diode. The vertical III-nitride thin-film power diode comprises a bottom contact layer of high-doped n-type epitaxial AlGaN semiconductor, a drift layer of low-doped n-type epitaxial AlGaN semiconductor on the topside of the bottom contact layer, and a top contact layer on the topside of the drift layer. The vertical AlGaN thin-film power diode can hold off high voltages (kV's) when operated under reverse bias.

The III-nitride device layers can be grown on a wider bandgap growth substrate and/or template layer, such as AlN and $Al_2O_3$. The template and growth substrate cannot conduct electricity, so they can be removed to enable vertical device operation. The removal can comprise bonding the topside of the device layers to a conductive host substrate, and then using a high fluence laser to lift-off the device layers from the non-conductive template and substrate.

BRIEF DESCRIPTION OF THE DRAWINGS

The detailed description will refer to the following drawings, wherein like elements are referred to by like numbers.

DETAILED DESCRIPTION OF THE INVENTION

Figure 1:
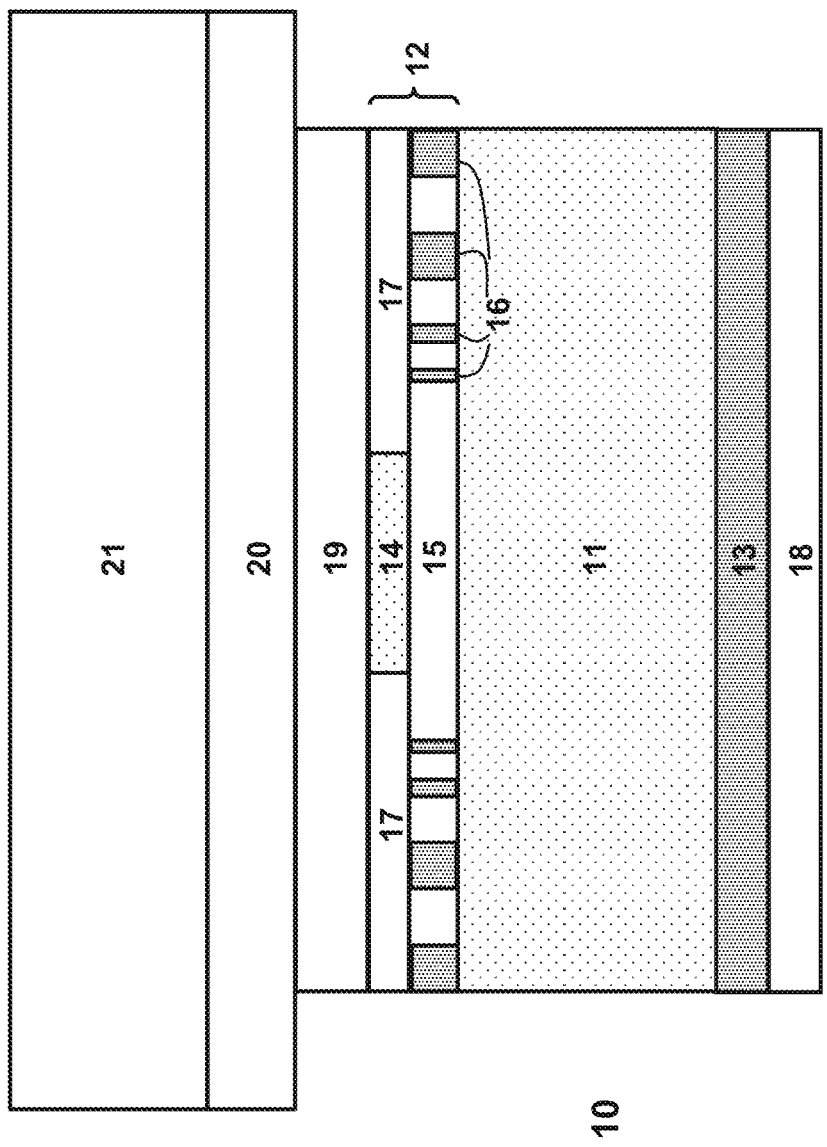
FIG. 1 is a schematic illustration of a vertical thin-film power diode.

In FIG. 1 is shown a vertical thin-film III-nitride power diode 10 comprising epitaxial III-nitride thin-film layers. The diode structure comprises a low-doped n-type drift layer 11 sandwiched between a top contact 12 and a high-doped n-type bottom layer 13. The top contact 12 can comprise an ohmic contact 14 to a high-doped p-type top layer 15 (as shown) or a Schottky contact (not shown) on the drift layer 11. The structure can further comprise a dielectric layer 17 outside the ohmic contact 14 or Schottky contact to help limit the electric field at the surface of the diode. The diode can further comprise an edge termination structure 16 comprising guard rings or junction termination extensions to avoid edge and surface breakdown. The structure can further comprise a bottom ohmic contact 18 to the high-doped n-type bottom layer 13. A host substrate 21 can be bonded with bond metals 19 and 20 to the top contact 12.

The epitaxial III-nitride device layers 11, 13, and 15 can comprise AlGaN semiconductors. The doping concentration of the intrinsic drift layer 11 can be less than about $1 \times 10^{16}/cm^3$. For example, the dopant can be Si. The drift layer 11 is preferably greater than about 4 µm thick. For example, the high-doped p-type top layer 15 can comprise p-type AlGaN or GaN. For example, the ohmic contact 14 can be Ni, Pd, or Pt. Alternatively, if a p-type top layer is not used, the top contact can be a Schottky contact formed from Ni, Pd, Pt, Mo, Rh, Au, Ru, or W directly on the intrinsic drift layer 11. For example, the dielectric layer 17 can comprise SiN, $SiO_2$, SiON, or $Al_2O_3$. For example, the host substrate 21 can comprise CuW or GaAs. For example, the bond metal 19 and 20 can be a bilayer of metals that form a low-melting eutectic, such as InPd. For example, the bottom ohmic contact 18 can comprise Ti or Al.

During operation, the intrinsic drift layer is flooded with charge carriers injected from the highly doped p- and n-layers (i.e., anode and cathode). In forward bias, the diode will conduct current when the injected electrons and holes reach an equilibrium point. Due to this high-level injection, due in turn to the depletion process, the electric field extends deeply into the drift layer. Because of the low doping in the intrinsic drift layer, most of the potential will drop across this region. Under reverse bias, the avalanche breakdown voltage can typically be significantly greater than 1 kilovolt.

Figure 2A:
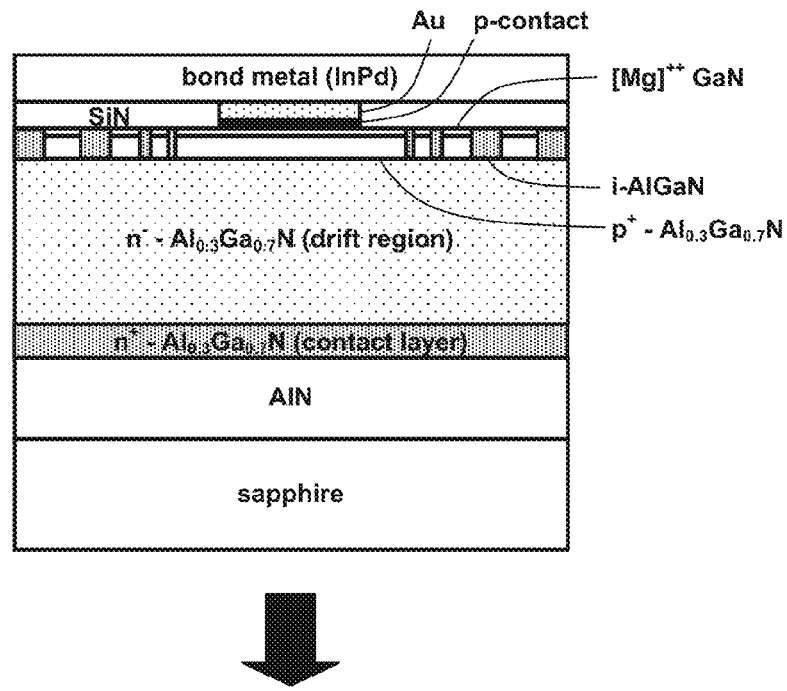
FIGS. 2(a)-(d) is a schematic illustration of the steps to fabricate an exemplary vertical III-nitride thin-film power diode.

FIGS. 2(a)-(d) show the steps to fabricate an exemplary vertical AlGaN thin-film power diode according to the present invention. Only one device is shown in the figure, but numerous devices can be arrayed on a wafer and created in parallel. As shown in FIG. 2(a), the epitaxial layers of the power diode can be grown on a non-conductive substrate or template layer comprising AlN, $Al_2O_3$, or AlGaN. These growth materials are transparent to the laser energy used in subsequent lift-off steps. Above the template layer and growth substrate (e.g., sapphire) is a high-doped n-type bottom contact layer, followed by a low doped AlGaN drift layer that is preferably greater than about 4 μm thick. The drift layer supports a majority of the vertical electric field under reverse bias. The drift layer can be topped by optional p-type AlGaN and GaN layers to complete the diode structure.

Figure 2B:
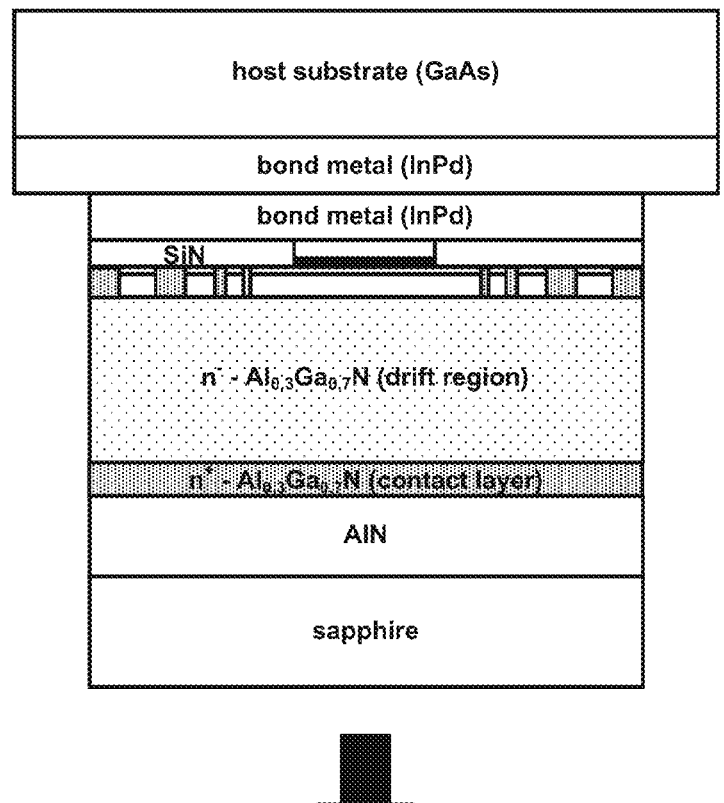

Fabrication steps are then performed on the top-side of the device, as shown in FIG. 2(b). If a p-type top layer is used then a p-type ohmic contact (as shown) that is Ni, Pd, or Pt-based can be deposited. If a p-type top layer is not used then a Schottky contact can be formed on the drift layer using high work function metals such as Ni, Pd, Pt, Mo, Rh, Au, Ru, and W. The rest of the p-side processing can comprise creating an edge termination structure (e.g., i-AlGaN) outside of the metal ohmic contact comprising guard ring or junction termination extension structures, trenching the wafer into smaller device areas and larger device areas, covering the uncontacted areas with a dielectric such as SiN or $SiO_2$, and finally covering the device wafer with a bond metal such as InPd. The device wafer is then bonded to a host substrate (e.g., GaAs) also coated with the bond metal. The device wafer and host wafer are brought into contact and then the temperature is raised to melt the bond metal and attach the host substrate to the device wafer. The host wafer needs to match the coefficient of thermal expansion (CTE) of the device wafer. For example, if a sapphire ($Al_2O_3$) device substrate is used (as shown), then appropriate host substrates can be CuW or GaAs.

Figure 2C:
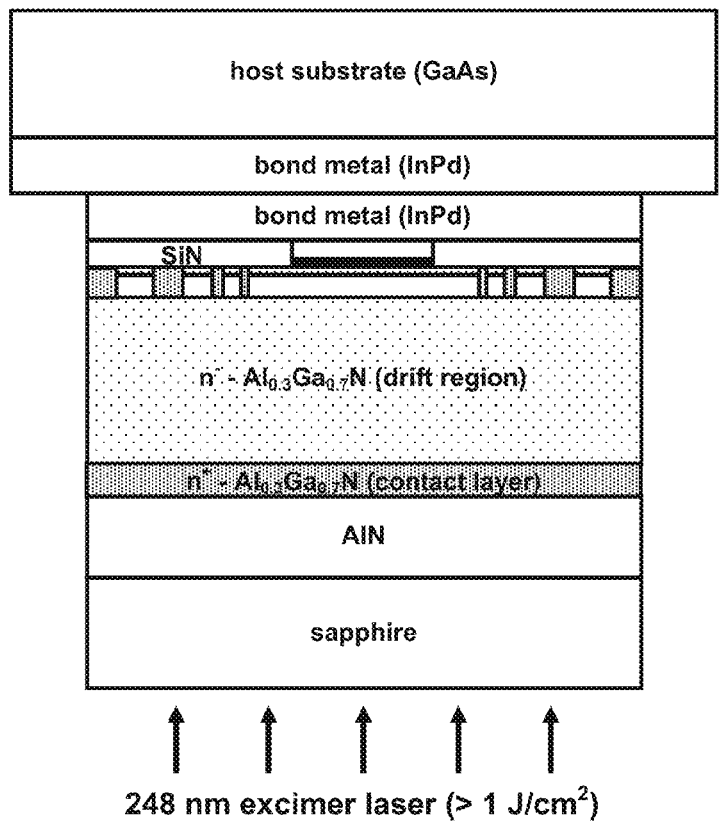
Figure 2C:
Figure 2D:
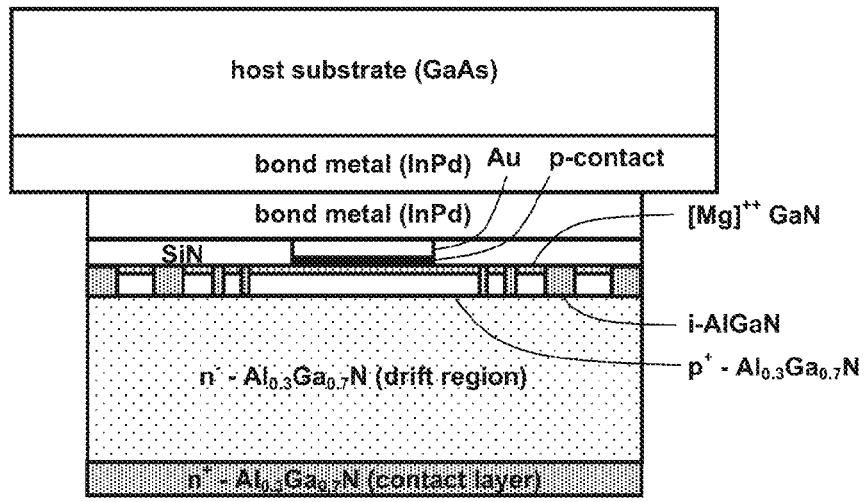
Figure 3:
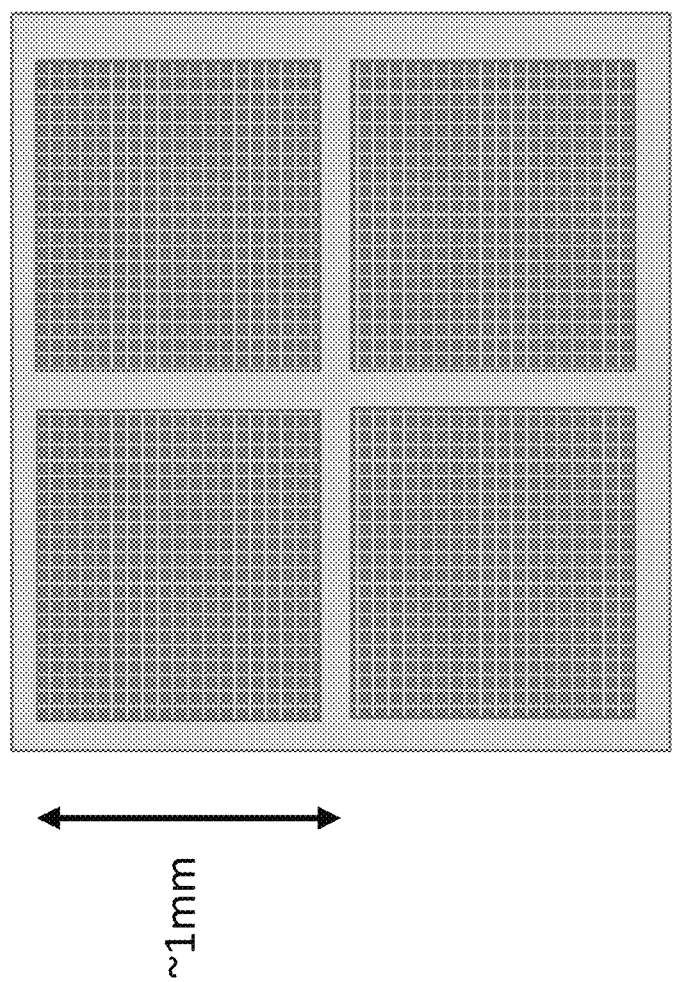
FIG. 3 is a top-view schematic illustration of a trenched device wafer. It consists of larger (in this case 1×1 mm squares) that match the laser lift-off exposure, and smaller device squares.

The backside of the wafer is then exposed to a high fluence laser, as shown in FIG. 2(c), in a step and repeat manner with a defined exposure area such as 1 mm×1 mm (as shown in FIG. 3). This trenching of the epitaxial device layers prevents these layers from cracking during laser separation from attached adjacent material. If the epitaxial layers have an Al composition of 0-60% then a 248 nm excimer laser can be used for laser separation. If the Al composition is higher >60% then a shorter wavelength, 193 nm excimer laser can be used. Typical laser fluences are ~0.5-1.5 $J/cm^2$. The energy is absorbed in the AlGaN device layers and the fast heating and slight differences in the coefficients of thermal expansion of the layers cause the device layers to separate, or lift-off, from the template layer and growth substrate, as shown in FIG. 2(d). The bond to the host substrate prevents cracks in the device layers.

Figures 4A, 4B:
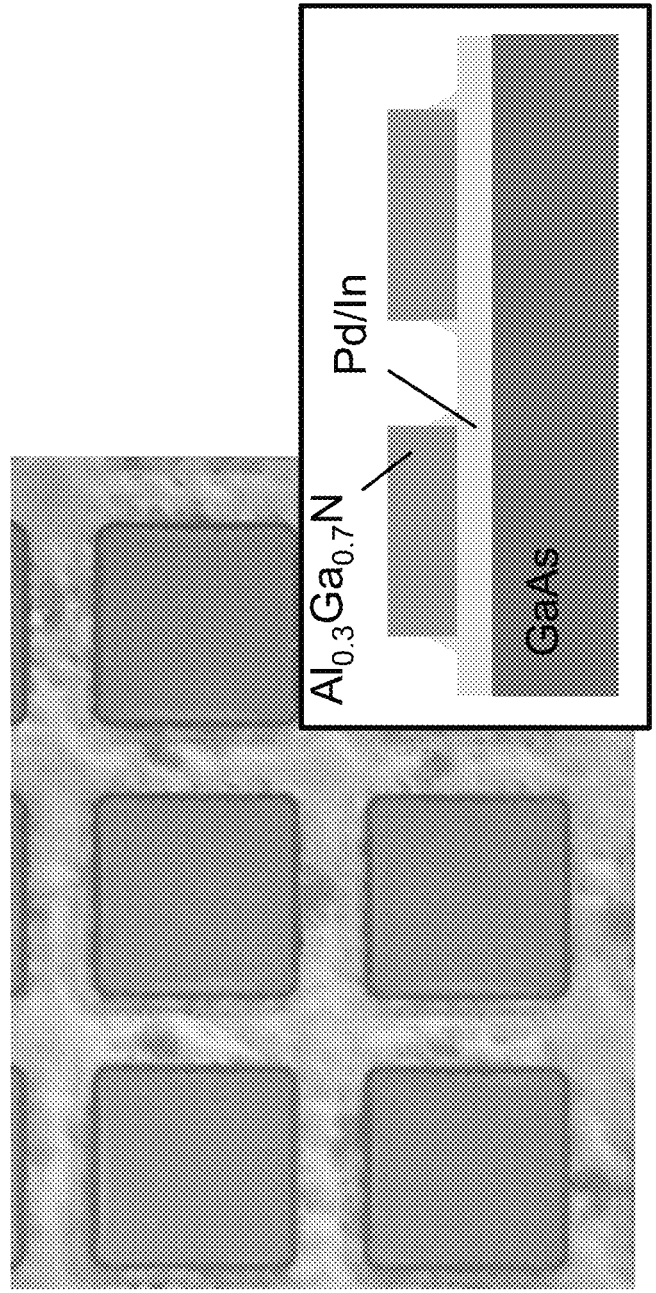
FIG. 4(a) is a top-view microscope image of $Al_{0.3}Ga_{0.7}N$ layers bonded to a GaAs host substrate with the AlN/sapphire template/growth substrate removed.
FIG. 4(b) is a cross-sectional schematic illustration of the vertical thin-film power diode structure shown in FIG. 4(a).
Figures 5A, 5B:
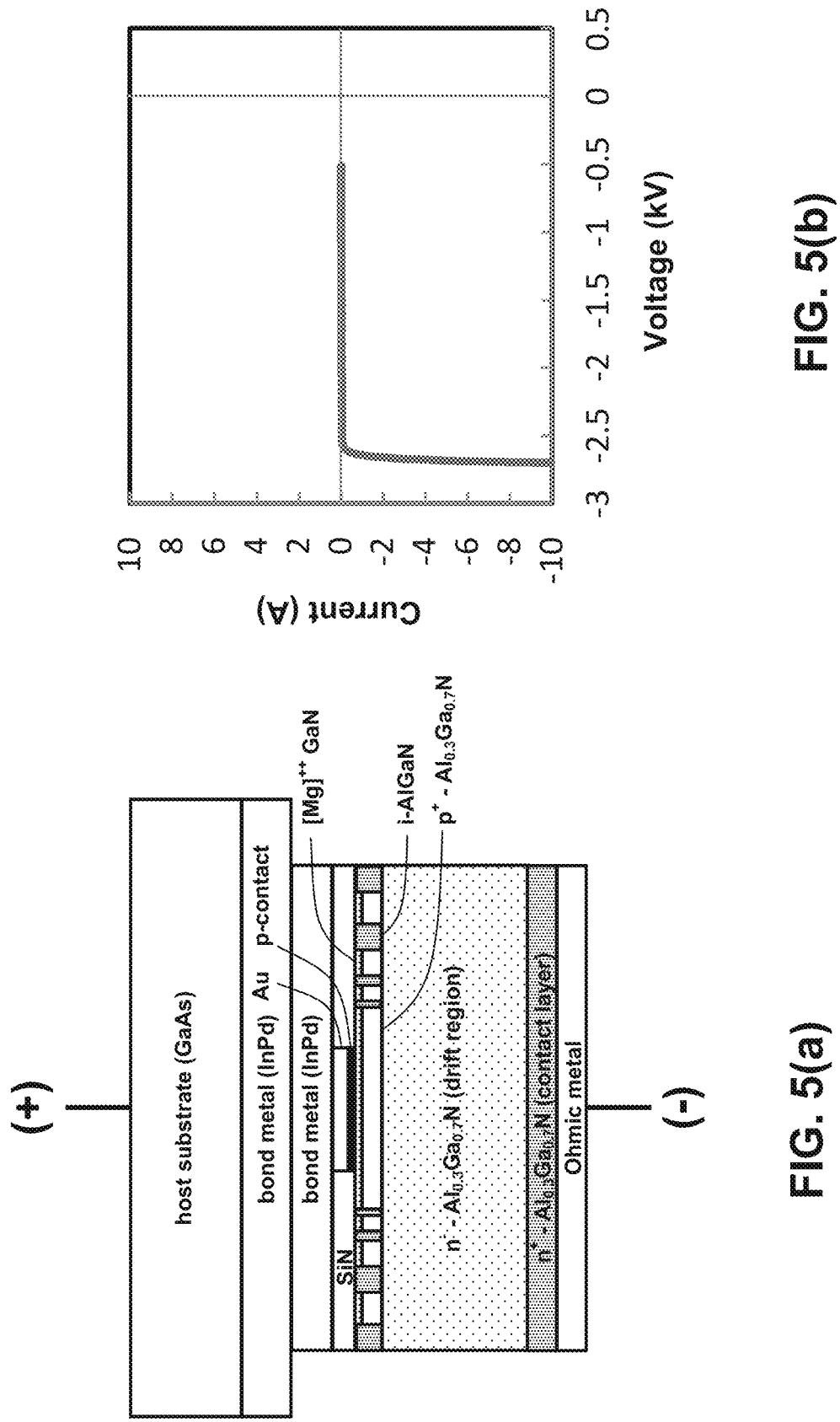
FIG. 5(a) is a cross-sectional schematic illustration of a vertical AlGaN thin-film power diode.
FIG. 5(b) is a graph of current vs. voltage characteristic of a power diode.

An example of AlGaN layers separated from the growth substrate and template layers is shown in FIG. 4. The AlGaN structure is trenched and then bonded to a GaAs host using Pd/In as a bonding metal. The wafer is then subject to a 1 $J/cm^2$ laser exposure at 248 nm through the sapphire growth substrate. The sapphire substrate and AlN template layers are separated from the AlGaN layers by lift-off. After removal of the substrate and template layer, an ohmic contact (e.g., Ti or Al) can be formed on the exposed high-doped n-type bottom layer. This can be accomplished by patterning a metal layer right after laser lift-off, or first preparing the surface by wet chemical, plasma etching, and chemo-mechanical polishing. A schematic illustration of the completed device is shown in FIG. 5(a).

The wide bandgap AlGaN semiconductor material and the vertical device processing enable power diodes that can hold off high voltages under reverse bias. In an ideal diode, the voltage across the end terminals of the diode is zero regardless of the current when forward-biased. Conversely, the leakage current is zero regardless of the voltage when reverse-biased. An example of a current vs voltage characteristic of a high power diode when reverse-biased is shown in FIG. 5(b). Under reverse voltage the avalanche breakdown is >2.5 kV, meaning that this diode can hold of voltages of 2.5 kV or less.

The present invention has been described as a vertical III-nitride thin-film power diode. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for fabricating a vertical III-nitride thin-film power diode, comprising:
   providing a growth substrate having a bandgap;
   a growing a template layer on the growth substrate;
   growing a high-doped n-type AlGaN bottom layer on the template layer, wherein the high-doped n-type AlGaN bottom layer has a smaller bandgap energy than the bandgap energies of the template layer and the growth substrate;
   growing a low-doped n-type AlGaN drift layer on the high-doped n-type AlGaN bottom layer;
   growing a top contact on the low-doped n-type AlGaN drift layer;
   bonding a host substrate to the top contact; and
   exposing the high-doped n-type AlGaN bottom layer through the growth substrate and the template layer to a light source having energy greater than the bandgap energy of the high-doped n-type AlGaN bottom layer but less than the bandgap energies of the template layer and the growth substrate, thereby causing the high-doped n-type AlGaN bottom layer to heat and separate from the template layer and growth substrate due to a difference in thermal expansion.

2. The method of claim 1, wherein the high-doped n-type AlGaN bottom layer has an Al composition less than 60%.

3. The method of claim 2, wherein the light source comprises a laser having a wavelength of 248 nm or less.

4. The method of claim 1, wherein the high-doped n-type AlGaN bottom layer has an Al composition greater than 60%.

5. The method of claim 4, wherein the light source comprises a laser having a wavelength of 193 nm or less.

6. The method of claim 1, further comprising growing an ohmic contact on the high-doped n-type AlGaN bottom layer that is exposed after separation of the template layer and the growth substrate.

7. The method of claim 6, wherein the ohmic contact comprises Ti or Al.

8. The method of claim 1, wherein the top contact comprises a high-doped p-type III-nitride top layer on the low-doped n-type AlGaN drift layer, an ohmic contact on the high-doped p-type III-nitride top layer, and a dielectric layer outside the ohmic contact.

9. The method of claim 8, wherein the high-doped p-type III-nitride top layer comprises AlGaN or GaN.

10. The method of claim 8, wherein the ohmic contact comprises Ni, Pd, or Pt.

11. The method of claim 8, wherein the dielectric layer comprises SiN, $SiO_2$, SiON, or $Al_2O_3$.

12. The method of claim 1, wherein the top contact comprises a Schottky contact on the low-doped n-type AlGaN drift layer and a dielectric layer outside the Schottky contact.

13. The method of claim 12, wherein the Schottky contact comprises Ni, Pd, Pt, Mo, Rh, Au, Ru, or W.

14. The method of claim 12, wherein the dielectric layer comprises SiN, $SiO_2$, SiON, or $Al_2O_3$.

15. The method of claim 1, wherein the doping of the low-doped n-type AlGaN drift layer is less than $1\times10^{16}/cm^3$.

16. The method of claim 15, wherein the dopant of the low-doped n-type AlGaN drift layer is Si.

17. The method of claim 1, wherein the thickness of the low-doped n-type AlGaN drift layer is greater than 4 μm.

18. The method of claim 1, wherein the growth substrate comprises $Al_2O_3$ or AlN.

19. The method of claim 1, wherein the template layer comprises AlN or AlGaN.

20. The method of claim 19, where in the template layer has an Al composition greater than the high-doped n-type AlGaN bottom layer.

21. The method of claim 1, wherein the top layer further comprises an edge termination structure.

22. The method of claim 21, wherein the edge termination structure comprises a guard ring or a junction termination extension.

23. The method of claim 1, wherein the host substrate comprises CuW or GaAs.

24. The method of claim 1, wherein the bonding comprises bonding a bond metal to the host substrate and the top contact and melting the bond metal.

25. The method of claim 24, wherein the bond metal comprises two or more metals that form a eutectic.

26. The method of claim 24, wherein the bond metal comprises InPd.

* * * * *